(12) United States Patent
Ichihashi et al.

(10) Patent No.: US 8,149,051 B2
(45) Date of Patent: Apr. 3, 2012

(54) SOLID-STATE IMAGE SENSOR

(75) Inventors: Yoshinari Ichihashi, Hashima (JP); Ryu Shimizu, Mizuho (JP); Kazuhiro Sasada, Hashima (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 277 days.

(21) Appl. No.: 11/340,571

(22) Filed: Jan. 27, 2006

(65) Prior Publication Data

US 2006/0170007 A1 Aug. 3, 2006

(30) Foreign Application Priority Data

Jan. 28, 2005 (JP) ................................ 2005-021396

(51) Int. Cl.
*H03F 1/32* (2006.01)

(52) U.S. Cl. ......... 330/149; 330/151; 330/291; 330/293
(58) Field of Classification Search ........................ None
See application file for complete search history.

(56) References Cited

U.S. PATENT DOCUMENTS

| 4,847,692 | A | * | 7/1989 | Tabei | 348/315 |
| 5,703,640 | A | * | 12/1997 | Miwada | 348/272 |
| 2003/0025208 | A1 | * | 2/2003 | Makiyama et al. | 257/773 |

OTHER PUBLICATIONS

Takahiko Ogo, et al., "A 1/4.5 type 1M-pixels FT-CCD camera module for mobile phone," ITE Technical Report, May 2004, pp. 13-16, vol. 28, No. 25.

* cited by examiner

*Primary Examiner* — Michael Shingleton
(74) *Attorney, Agent, or Firm* — McDermott Will & Emery LLP (57) ABSTRACT

A solid-state image sensor capable of suppressing color mixture while suppressing increase of load capacitances of transfer gates and a short circuit between two adjacent transfer gates is provided. This solid-state image sensor comprises a plurality of transfer gates and a shielding material line blocking light incident from above a prescribed pixel upon another pixel adjacent to the prescribed pixel. The shielding material line has a downward projecting portion on a region corresponding to at least one transfer gate entering an ON-state in photoreception.

34 Claims, 7 Drawing Sheets

SOLID-STATE IMAGE SENSOR

BACKGROUND OF THE INVENTION

1. Field of the Invention

The present invention relates to a solid-state image sensor, and more particularly, it relates to a solid-state image sensor comprising a shielding material line for blocking light incident from above a prescribed pixel upon another pixel adjacent to the prescribed pixel.

2. Description of the Background Art

Various solid-state image sensors each comprising a shielding material line for blocking light incident from above a prescribed pixel upon another pixel adjacent to the prescribed pixel are known in general. Such a solid-state image sensor is disclosed in ITE Technical Report Vol. 28, No. 25, pp. 13-16, IST2004-25 (May, 2004), for example.

Figure 16:
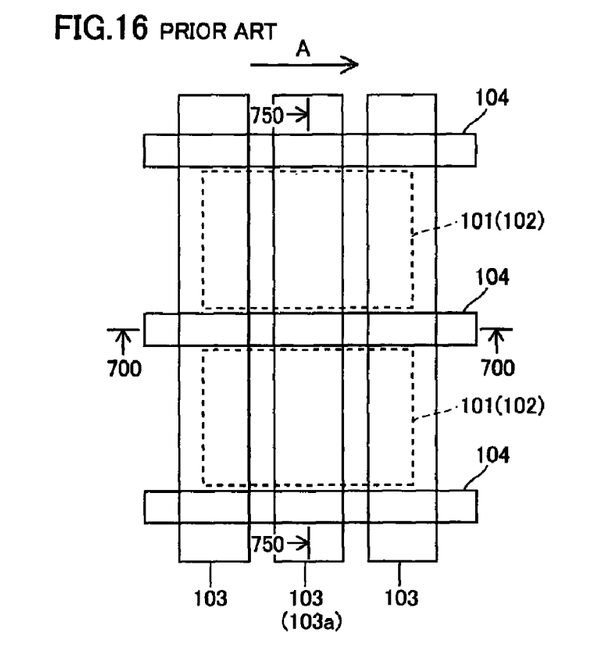
FIG. 16 is a plan view for illustrating the structure of an imaging portion of an exemplary conventional solid-state image sensor.
Figure 17:
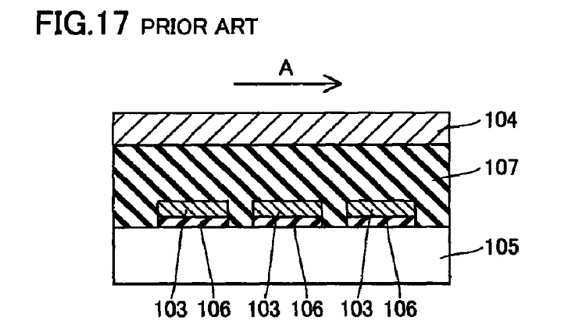
FIG. 17 is a sectional view of the imaging portion of the exemplary conventional solid-state image sensor taken along the line 700-700 in FIG. 16.
Figure 18:
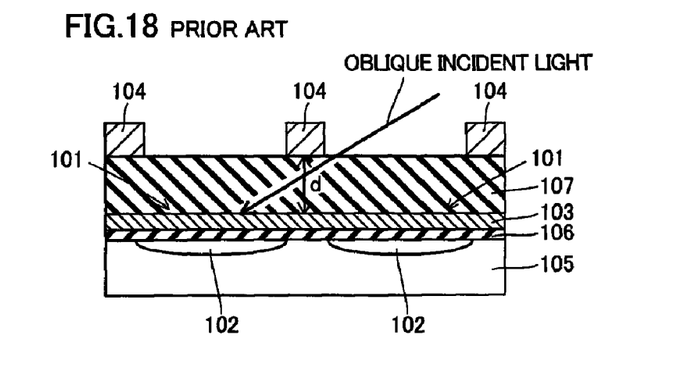
FIG. 18 is a sectional view of the imaging portion of the exemplary conventional solid-state image sensor taken along the line 750-750 in FIG. 16.

FIG. 16 is a plan view showing the structure of an imaging portion of an exemplary conventional solid-state image sensor comprising shielding material lines. FIG. 17 is a sectional view of the imaging portion of the exemplary conventional solid-state image sensor taken along the line 700-700 in FIG. 16. FIG. 18 is a sectional view of the imaging portion of the exemplary conventional solid-state image sensor taken along the line 750-750 in FIG. 16. Referring to FIG. 16, the imaging portion of the exemplary conventional solid-state image sensor comprising shielding material lines is provided with a plurality of pixels 101. Photoelectric conversion portions 102 are provided on regions corresponding to the pixels 101 respectively.

A plurality of transfer gates 103 for transferring electrons generated by the photoelectric conversion portions 102 are provided to extend along a direction perpendicular to an electron transfer direction (along arrow A) at prescribed intervals. Three such transfer gates 103 are provided every pixel 101. Among the three transfer gates 103 provided in correspondence to each pixel 101, the central transfer gate 103a enters an ON-state in photoreception. Thus, a potential well is formed on a region located under the central transfer gate 103a of the three transfer gates 103 in photoreception, for storing electrons generated by photoelectric conversion in this potential well. Shielding material lines 104 are provided on regions located between adjacent pairs of pixels 101 arranged along the direction perpendicular to the electron transfer direction (along arrow A) above the transfer gates 103 to extend along the electron transfer direction (along arrow A). Each shielding material line 104 is provided for suppressing incidence of light from above a prescribed pixel 101 upon another pixel 101 adjacent to the prescribed pixel 101 in the direction perpendicular to the electron transfer direction (along arrow A).

In the imaging portion of the exemplary conventional solid-state image sensor, a plurality of gate insulating films 106 are formed on the upper surface of a substrate 105 at prescribed intervals, as shown in FIG. 17. The substrate 105 is formed with the photoelectric conversion portions 102 corresponding to the aforementioned pixels 101 respectively, as shown in FIG. 18. The aforementioned transfer gates 103 are formed on the gate insulating films 106 respectively. An insulating film 107 is formed to cover the gate insulating films 106 and the transfer gates 103. The aforementioned shielding material lines 104 are formed on prescribed regions of the insulating film 107. The shielding material lines 104 and the transfer gates 103 are at a prescribed distance d.

In the exemplary conventional solid-state image sensor comprising the shielding material lines 104 shown in FIG. 16, however, unintentional incident light may be obliquely incident from above a prescribed pixel 101 upon another pixel 101 adjacent to the prescribed pixel 101 through a region located under the corresponding shielding material line 104, as shown in FIG. 18. In this case, color mixture disadvantageously results from the incidence of the unintentional incident light upon the pixel 101 adjacent to the prescribed pixel 101. This problem of color mixture may conceivably be solved by approaching the shielding material lines 104 toward the substrate 105 thereby blocking the aforementioned unintentional oblique incident light with the corresponding shielding material line 104. In this case, however, the interval between the corresponding shielding material line 104 and all transfer gates 103 intersecting with the shielding material line 104 through the insulating film 107 is disadvantageously reduced. Thus, capacitances between the shielding material line 104 and the corresponding transfer gates 103 are disadvantageously increased to increase load capacitances of the transfer gates 103 or easily cause a short circuit between two adjacent transfer gates 103 through the shielding material line 104.

SUMMARY OF THE INVENTION

The present invention has been proposed in order to solve the aforementioned problem, and an object of the present invention is to provide a solid-state image sensor capable of suppressing color mixture while suppressing increase of load capacitances of transfer gates and a short circuit between two adjacent transfer gates.

In order to attain the aforementioned object, a solid-state image sensor according to an aspect of the present invention comprises a plurality of transfer gates for transferring charge and a shielding material line arranged on a region corresponding to the space between two adjacent pixels above the transfer gates to extend in a direction intersecting with the extensional direction of the transfer gates for blocking light incident from above a prescribed pixel upon another pixel adjacent to the prescribed pixel. The shielding material line has a downward projecting portion on a region corresponding to at least one transfer gate entering an ON-state in photoreception.

In the solid-state image sensor according to this aspect, as hereinabove described, the shielding material line is so provided with the downward projecting portion on the region corresponding to at least one transfer gate entering an ON-state in photoreception that this projecting portion can effectively block light (oblique incident light) incident from above the prescribed pixel upon a region of another pixel, adjacent to the prescribed pixel, located under the transfer gate entering an ON-state in photoreception through a region located under the shielding material line. Thus, it is possible to suppress color mixture resulting from incidence of unintentional oblique incident light upon the region of the pixel, adjacent to the prescribed pixel, located under the transfer gate entering an ON-state in photoreception for storing charge. The projecting portion provided on the region of the shielding material line corresponding to at least one transfer gate entering an ON-state in photoreception so blocks the aforementioned oblique incident light that load capacitances of the transfer gates can be inhibited from increase resulting from reduction of the interval between the overall shielding material line and the transfer gates as compared with a case of blocking the aforementioned oblique incident light by approaching the overall shielding material line toward the transfer gates. Further, the projecting portion provided on the region of the shielding material line corresponding to at least one transfer gate entering an ON-state in photoreception so blocks the aforementioned oblique incident light that a short circuit caused between two adjacent transfer gates through the shielding material line can be suppressed as compared with the case of blocking the aforementioned oblique incident light by approaching the overall shielding material line toward the transfer gates.

In the solid-state image sensor according to the aforementioned aspect, the shielding material line is preferably made of a conductive material. According to this structure, the shielding material line can function as a signal line transmitting a prescribed signal.

In this case, the shielding material line and the transfer gates are preferably connected with each other through a connecting portion, and the shielding material line preferably also has a function for serving as a signal line transmitting a driving signal for driving the transfer gates. According to this structure, no signal line may be separately provided for transmitting the driving signal for driving the transfer gates to the transfer gates, whereby the solid-state image sensor can be downsized. Further, the shielding material line and the transfer gates are connected with each other and the shielding material line arranged on the region corresponding to the space between two adjacent pixels functions also as the signal line transmitting the driving signal so that the driving signal can be transmitted to the transfer gates by connecting the shielding material line and the transfer gates with each other in the vicinity of the pixels generating charge by photoelectric conversion and storing the same. Thus, the distance for transmitting the driving signal to regions of the transfer gates corresponding to the pixels can be reduced as compared with a case of separately providing a signal line transmitting the driving signal on a peripheral region of an imaging portion including a plurality of pixels and connecting the signal line and the transfer gates with each other on the peripheral region for transmitting the driving signal to the transfer gates. Therefore, deterioration of the driving signal transmitted to the regions of the transfer gates corresponding to the pixels can be reduced. Thus, the charge generated in the pixels can be more reliably transferred through the regions of the transfer gates corresponding to the pixels.

In the aforementioned structure having the shielding material line and the transfer gates connected with each other through the connecting portion, the connecting portion may be integrally provided on the shielding material line. According to this structure, the connecting portion may not be separately formed when the shielding material line and the transfer gates are connected with each other through the connecting portion, whereby a manufacturing process can be inhibited from complication.

In the aforementioned structure having the shielding material line and the transfer gates connected with each other through the connecting portion, the connecting portion may be provided independently of the shielding material line. According to this structure, the shielding material line and the transfer gates can be easily connected with each other through the connecting portion provided independently of the shielding material line.

In the aforementioned structure having the shielding material line and the transfer gates connected with each other through the connecting portion, the solid-state image sensor preferably further comprises a reflex inhibition film consisting of an insulating film formed on the transfer gates, and the connecting portion is preferably formed to reach the transfer gates through the reflex inhibition film. According to this structure, the connecting portion can be easily connected to the transfer gates when the reflex inhibition film consisting of the insulating film is formed on the transfer gates.

In the aforementioned structure having the shielding material line and the transfer gates connected with each other through the connecting portion, at least a partial projecting portion provided on the shielding material line is preferably directly connected to the transfer gates thereby functioning as the connecting portion. According to this structure, at least the partial projecting portion provided on the shielding material line and the connecting portion for connecting the shielding material line and the transfer gates with each other may not be formed independently of each other, whereby the manufacturing process can be simplified.

In this case, the solid-state image sensor preferably further comprises a reflex inhibition film consisting of an insulating film formed on the transfer gates, and the projecting portion of the shielding material line is preferably formed to reach the transfer gates through the reflex inhibition film. According to this structure, the projecting portion of the shielding material line can be easily connected to the transfer gates when the reflex inhibition film consisting of the insulating film is formed on the transfer gates.

In the aforementioned structure having the shielding material line and the transfer gates connected with each other through the connecting portion, three transfer gates are preferably arranged for a single pixel, the three transfer gates corresponding to the single pixel are preferably driven by three-phase driving signals, three shielding material lines transmitting the three-phase driving signals respectively preferably constitute a group, and the projecting portion is preferably provided on a region of at least one shielding material line, included in the three shielding material lines constituting the group, corresponding to the transfer gate entering an ON-state in photoreception. According to this structure, the projecting portion provided on at least one of the three shielding material lines transmitting the three-phase driving signals respectively can effectively block light (oblique incident light) incident from above the prescribed pixel upon the region of another pixel, adjacent to the prescribed pixel, located under the transfer gate entering an ON-state in photoreception through the region located under the shielding material line.

In this case, projecting portions are preferably provided on regions of all shielding material lines, constituting the group, corresponding to the transfer gate entering an ON-state in photoreception. According to this structure, the projecting portions provided on all of the three shielding material lines transmitting the three-phase driving signals respectively can more effectively block the light (oblique incident light) incident from above the prescribed pixel upon the region of another pixel, adjacent to the prescribed pixel, located under the transfer gate entering an ON-state in photoreception through regions located under the shielding material lines.

In the aforementioned structure having the shielding material line and the transfer gates connected with each other through the connecting portion, the connecting portion is preferably integrally provided on a flat portion of the shielding material line other than the projecting portion and connected to the remaining transfer gate other than the transfer gate entering an ON-state in photoreception, and the projecting portion of the shielding material line is preferably directly connected to the transfer gate entering an ON-state in photoreception. According to this structure, the remaining transfer gate other than the transfer gate entering an ON-state in photoreception and the transfer gate entering an ON-state in photoreception can be easily connected to the corresponding shielding material line respectively.

In the aforementioned structure having the shielding material line and the transfer gates connected with each other through the connecting portion, a flat portion of the shielding material line other than the projecting portion may be connected to the remaining transfer gate other than the transfer gate entering an ON-state in photoreception through a connecting portion provided independently of the shielding material line, and the projecting portion of the shielding material line may be connected to the transfer gate entering an ON-state in photoreception through the connecting portion provided independently of the shielding material line. According to this structure, the remaining transfer gate other than the transfer gate entering an ON-state in photoreception and the transfer gate entering an ON-state in photoreception can be easily connected to the corresponding shielding material line respectively.

In the aforementioned structure having the shielding material line and the transfer gates connected with each other through the connecting portion, a flat portion of the shielding material line other than the projecting portion may be connected to the remaining transfer gate other than the transfer gate entering an ON-state in photoreception through the connecting portion provided independently of the shielding material line, and the projecting portion of the shielding material line may be directly connected to the transfer gate entering an ON-state in photoreception. According to this structure, the remaining transfer gate other than the transfer gate entering an ON-state in photoreception and the transfer gate entering an ON-state in photoreception can be easily connected to the corresponding shielding material line respectively.

In the solid-state image sensor according to the aforementioned structure, the maximum width of the projecting portion is preferably larger than the width of the transfer gate entering an ON-state in photoreception. According to this structure, the part of the projecting portion having the maximum width can more effectively block the light obliquely incident from above the prescribed pixel upon the region of another pixel, adjacent to the prescribed pixel, located under the transfer gate entering an ON-state in photoreception through the region located under the shielding material line.

In the solid-state image sensor according to the aforementioned aspect, the projecting portion is preferably formed to be reduced in width as approaching to the transfer gates. According to this structure, the projecting portion can be so formed that a part opposite to the transfer gates has a larger width and another part closer to the transfer gates has a smaller width. Thus, the part, opposite to the transfer gates, of the projecting portion having the larger width can more effectively block the light obliquely incident from above the prescribed pixel upon the region of another pixel, adjacent to the prescribed pixel, located under the transfer gate entering an ON-state in photoreception through the region located under the shielding material line. If the part, closer to the transfer gates, of the projecting portion having the smaller width is formed narrower than the transfer gates when the projecting portion functions also as the connecting portion, the projecting portion can be inhibited from projecting toward a region outside a prescribed transfer gate directly connected with the same even if the projecting portion deviates from the prescribed transfer gate. Thus, the prescribed transfer gate and another transfer gate adjacent to the prescribed transfer gate can be inhibited from a short circuit resulting from projection of the projecting portion toward the region outside the prescribed transfer gate.

In this case, the width of the bottom of the projecting portion is preferably larger than the width of the transfer gates. According to this structure, the bottom of the projecting portion having the larger width can easily more effectively block the light obliquely incident from above the prescribed pixel upon the region of another pixel, adjacent to the prescribed pixel, located under the transfer gate entering an ON-state in photoreception through the region located under the shielding material line.

In the aforementioned structure having the projecting portion formed to be reduced in width as approaching to the transfer gates, the width of the forward end of the projecting portion is preferably smaller than the width of the transfer gates. According to this structure, the projecting portion can be easily inhibited from projecting toward the region outside the prescribed transfer gate when the projecting portion is directly connected to the prescribed transfer gate.

In this case, the forward end of the projecting portion is preferably directly connected to the transfer gates. According to this structure, the projecting portion and the prescribed transfer gate can be easily connected with each other while inhibiting the projecting portion from projecting toward the region outside the prescribed transfer gate when the projecting portion is directly connected to the prescribed transfer gate.

In the solid-state image sensor according to the aforementioned aspect, the projecting portion of the shielding material line is preferably provided on a region corresponding to all transfer gates entering ON-states in photoreception. According to this structure, the projecting portion of the shielding material line provided on the region corresponding to all transfer gates entering ON-states in photoreception can more effectively block the light (oblique incident light) incident from above the prescribed pixel upon the region of another pixel, adjacent to the prescribed pixel, located under the transfer gates entering ON-states in photoreception through the region located under the shielding material line.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Referring to FIGS. 1 to 5, a first embodiment of the present invention is applied to a frame transfer solid-state image sensor.

Figure 1:
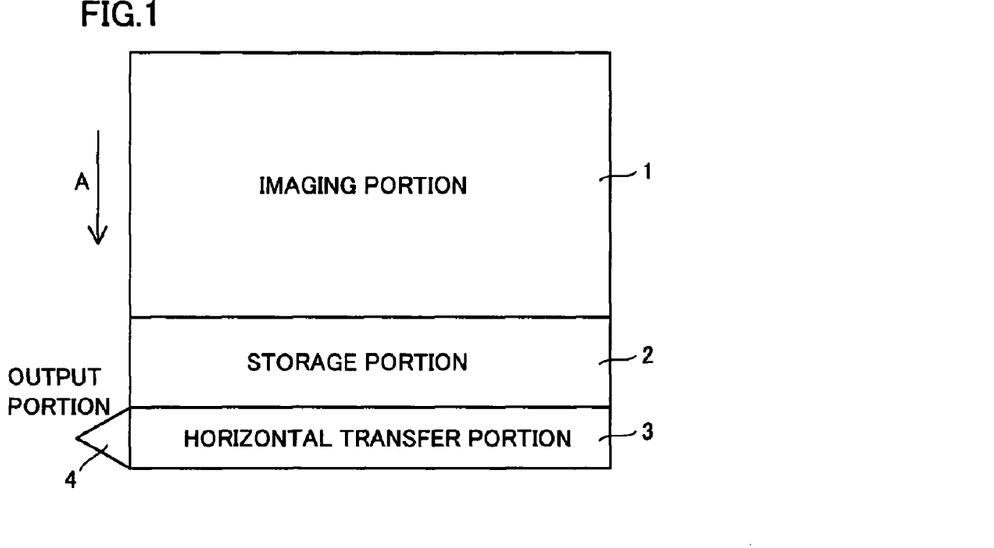
FIG. 1 is a schematic diagram showing the overall structure of a solid-state image sensor according to a first embodiment of the present invention.
Figure 2:
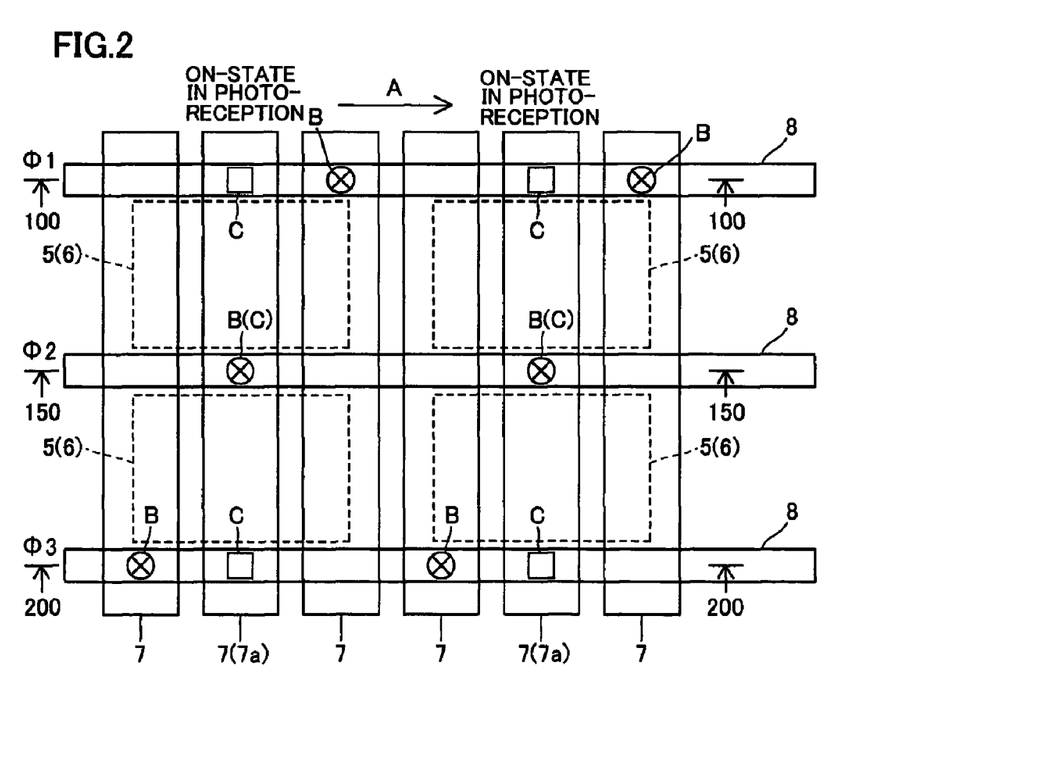
FIG. 2 is a plan view for illustrating the structure of an imaging portion of the solid-state image sensor according to the first embodiment shown in FIG. 1.

As shown in FIG. 1, the frame transfer solid-state image sensor according to the first embodiment comprises an imaging portion 1, a storage portion 2, a horizontal transfer portion 3 and an output portion 4. The imaging portion 1 is provided for performing photoelectric conversion by incidence of light. A plurality of pixels 5 are arranged on the imaging portion 1 in the form of a matrix, as shown in FIG. 2. Photoelectric conversion portions 6 are provided on regions corresponding to the pixels 5 respectively. The imaging portion 1 has a function of storing generated electrons (charge) and transferring the same to the storage portion 2. The storage portion 2 has a function of storing the electrons received from the imaging portion 1 and transferring the same to the horizontal transfer portion 3 (see FIG. 1). The horizontal transfer portion 3 has a function of sequentially transferring the electrons received from the storage portion 2 to the output portion 4. The output portion 4 has a function of outputting the electrons received from the horizontal transfer portion 3 as electric signals.

A plurality of transfer gates 7 for transferring electrons are provided on the imaging portion 1 to extend along a direction perpendicular to an electron transfer direction (arrow A in FIG. 1) at prescribed intervals, as shown in FIG. 2. Three transfer gates 7 are provided every pixel 5. Among the three transfer gates 7 provided in correspondence to each pixel 5, the central transfer gate 7a enters an ON-state in photoreception. Thus, a potential well is formed on a region located under the central transfer gate 7a of the three transfer gates 7 in photoreception, for storing electrons generated by photoelectric conversion in this potential well. Shielding material lines 8 are provided on regions located between adjacent pairs of pixels 5 arranged along the direction perpendicular to the electron transfer direction (along arrow A) above the transfer gates 7, to extend along the electron transfer direction (along arrow A). Each shielding material line 8 is provided for blocking light obliquely incident from above a prescribed pixel 5 upon another pixel 5 adjacent to the prescribed pixel 5.

According to the first embodiment, the shielding material lines 8 and prescribed transfer gates 7 are connected with each other through connecting portions 8c described later on the intersectional positions (positions B in FIG. 2) therebetween. Thus, the shielding material lines 8 function also as signal lines transmitting three-phase clock signals $\Phi1$ to $\Phi3$ for driving the transfer gates 7 to the aforementioned three transfer gates 7 respectively. The imaging portion 1 brings the three transfer gates 7 in the same pixel 5 into ON-states one by one with the three-phase clock signals $\Phi1$ to $\Phi3$ respectively, thereby sequentially transferring electrons stored in a region located under a prescribed transfer gate 7 in the same pixel 5 to regions located under the transfer gates 7 other than the prescribed transfer gate 7 in the same pixel 5.

Figure 3:
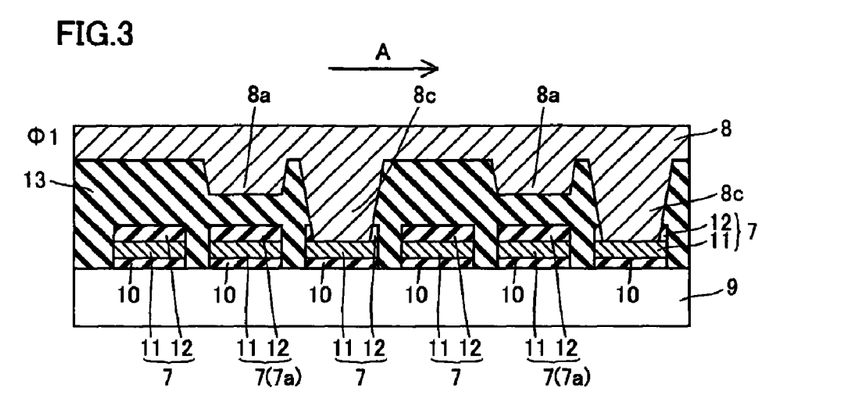
FIG. 3 is a sectional view of the imaging portion of the solid-state image sensor according to the first embodiment taken along the line 100-100 in FIG. 2.

In the imaging portion 1, a plurality of gate insulating films 10 of $SiO_2$ having a thickness of about 30 nm are formed on the upper surface of a substrate 9 at prescribed intervals, as shown in FIG. 3. The substrate 9 is formed with the aforementioned photoelectric conversion portions 6 (see FIG. 2) of the pixels 5. Polysilicon films 11 having a thickness of about 70 nm are formed on the gate insulating films 10 respectively. SiN films 12 having a thickness of about 50 nm are formed on the polysilicon films 11 respectively. These SiN films 12 function as reflex inhibition films for inhibiting the upper surfaces of the polysilicon films 11 from reflecting incident light. The SiN Films 12 and the polysilicon films 11 constitute the aforementioned transfer gates 7. An $SiO_2$ film 13 is formed to cover the gate insulating films 10, the polysilicon films 11 and the SiN films 12. The aforementioned shielding material lines 8 are provided on prescribed regions of the $SiO_2$ film 13. The shielding material lines 8, having a thickness of about 500 nm, are made of Al. Alternatively, the shielding material lines 8 may be made of W (tungsten).

Figure 4:
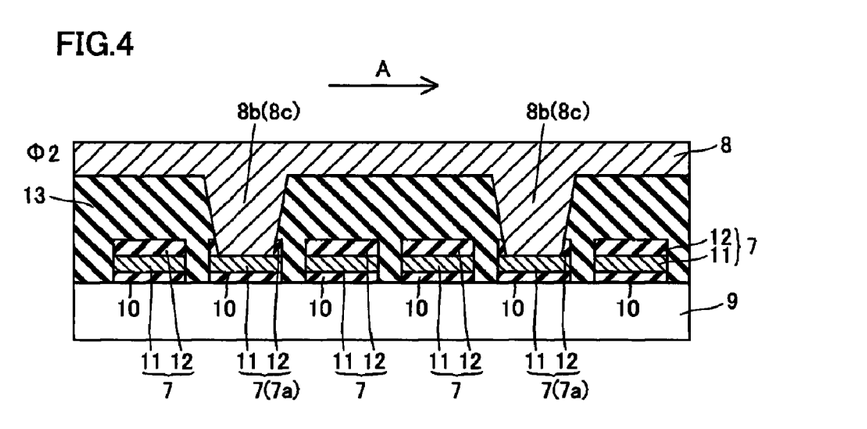
FIG. 4 is a sectional view of the imaging portion of the solid-state image sensor according to the first embodiment taken along the line 150-150 in FIG. 2.
Figure 5:
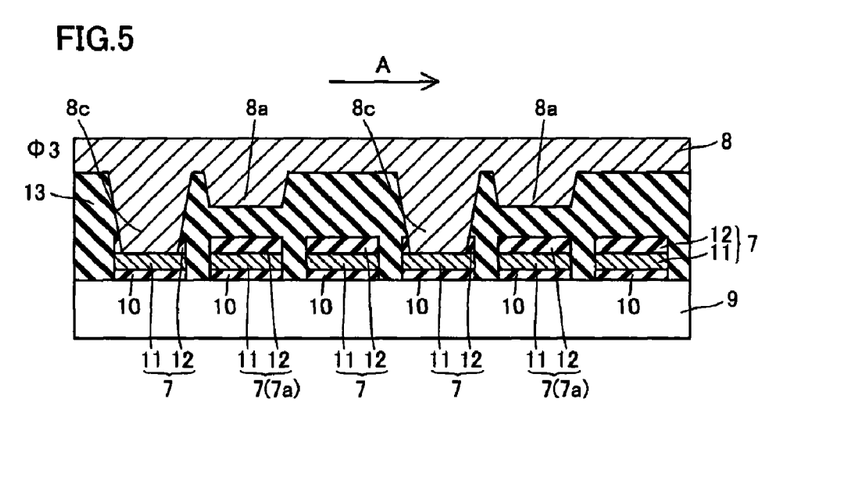
FIG. 5 is a sectional view of the imaging portion of the solid-state image sensor according to the first embodiment taken along the line 200-200 in FIG. 2.

According to the first embodiment, the shielding material lines 8 are provided with downward projecting portions 8a (8b) on positions (positions C in FIG. 2) intersecting with the transfer gates 7a entering ON-states in photoreception, as shown in FIGS. 3 to 5. Each projecting portion 8a (8b) is provided for blocking light obliquely incident from above the prescribed pixel 5 (see FIG. 2) upon the region located under the transfer gate 7a, entering an ON-state in photoreception, corresponding to another pixel 5 adjacent to the prescribed pixel 5 through the region located under the corresponding shielding material line 8. The projecting portions 8a project downward by about 300 nm from the lower surfaces of the shielding material lines 8 respectively. Further, the projecting portions 8a are formed to be reduced in width as approaching to the transfer gates 7a (downward).

According to the first embodiment, the shielding material lines 8 are integrally provided with the connecting portions 8c connecting the shielding material lines 8 and the transfer gates 7 with each other on the positions B in FIG. 2, as shown in FIGS. 3 to 5. Thus, the shielding material line 8 transmitting the clock signal Φ1 and the transfer gates 7 adjacent to the transfer gates 7a, entering ON-states in photoreception, along the electron transfer direction (along arrow A) are connected with each other through the corresponding connecting portions 8c. Further, the shielding material line 8 transmitting the clock signal Φ3 and the transfer gates 7 adjacent to the transfer gates 7a, entering ON-states in photoreception, oppositely to the electron transfer direction (along arrow A) are connected with each other through the corresponding connecting portions 8c.

According to the first embodiment, projecting portions 8b provided on the shielding material line 8 (see FIG. 2) transmitting the clock signal Φ2 are directly connected to the transfer gates 7a entering ON-states in photoreception as shown in FIG. 4, thereby functioning also as the connecting portions 8c. The connecting portions 8c, projecting downward from the lower surfaces of the shielding material lines 8, are formed to reach the polysilicon films 11 through the SiN films 12 of the corresponding transfer gates 7. The connecting portions 8c (projecting portions 8b) project downward by about 450 nm from the lower surfaces of the shielding material lines 8.

According to the first embodiment, the connecting portions 8c are formed to be reduced in width as approaching to the transfer gates 7. The width of parts of the connecting portions 8c in contact with the polysilicon films 11 of the transfer gates 7 is smaller than that of the transfer gates 7.

According to the first embodiment, as hereinabove described, the shielding material lines 8 are provided with the downward projecting portions 8a (8b) on the regions corresponding to the transfer gates 7a entering ON-states in photoreception so that the projecting portions 8a (8b) can effectively block light (oblique incident light) incident from above prescribed pixels 5 upon regions of other pixels 5, adjacent to the prescribed pixels 5, located under the transfer gates 7a entering ON-states in photoreception through the regions located under the shielding material lines 8. Thus, it is possible to suppress color mixture resulting from unintentional incidence of the aforementioned oblique incident light upon the regions of other pixels 5, adjacent to the prescribed pixels 5, located under the transfer gates 7a entering ON-states for storing charge upon photoreception.

According to the first embodiment, the projecting portions 8a (8b) provided on the regions of the shielding material lines 8 corresponding to the transfer gates 7a entering ON-states in photoreception so block the aforementioned oblique incident light that load capacitances of the transfer gates 7 can be inhibited from increase resulting from reduction of the intervals between the overall shielding material lines 8 and the transfer gates 7 as compared with a case of blocking the aforementioned oblique incident light by approaching the overall shielding material lines 8 toward the transfer gates 7.

According to the first embodiment, the projecting portions 8a (8b) provided on the regions of the shielding material lines 8 corresponding to the transfer gates 7a entering ON-states in photoreception so block the aforementioned oblique incident light that it is possible to suppress short circuits caused between adjacent pairs of transfer gates 7 through the shielding material lines 8 as compared with the case of blocking the aforementioned oblique incident light by approaching the overall shielding material lines 8 toward the transfer gates 7.

According to the first embodiment, the shielding material lines 8 and the transfer gates 7 are connected with each other through the connecting portions 8c while the shielding material lines 8 function also as the signal lines transmitting the clock signals Φ1 to Φ3 for driving the transfer gates 7 respectively, whereby no signal lines may be separately provided for transmitting the clock signals Φ1 to Φ3 for driving the transfer gates 7 and the solid-state image sensor can be downsized.

According to the first embodiment, the shielding material lines 8 and the transfer gates 7 are connected with each other while the shielding material lines 8 arranged on the regions corresponding to the spaces between adjacent pairs of pixels 5 function also as the signal lines transmitting the clock signals Φ1 to Φ3 respectively, whereby the clock signals Φ1 to Φ3 can be transmitted to the transfer gates 7 by connecting the shielding material lines 8 and the transfer gates 7 with each other in the vicinity of the pixels 5 generating electrons by photoelectric conversion and storing the same. Thus, the distance for transmitting the clock signals Φ1 to Φ3 to the regions of the transfer gates 7 corresponding to the pixels 5 can be reduced as compared with a case of separately providing signal lines transmitting the clock signals Φ1 to Φ3 on a peripheral region of the imaging portion 1 including the plurality of pixels 5 and transmitting the clock signals Φ1 to Φ3 to the transfer gates 7 by connecting the signal lines and the transfer gates 7 with each other on the peripheral region. Therefore, deterioration of the clock signals Φ1 to Φ3 transmitted to the regions of the transfer gates 7 corresponding to the pixels 5 can be reduced. Thus, electrons generated in the pixels 5 can be more reliably transferred through the regions of the transfer gates 7 corresponding to the pixels 5.

According to the first embodiment, the shielding material lines 8 are so integrally provided with the connecting portions 8c connecting the shielding material lines 8 and the transfer gates 7 with each other that no connecting portions may be separately formed, whereby a manufacturing process can be inhibited from complication.

According to the first embodiment, the projecting portions 8b provided on the shielding material line 8 transmitting the clock signal Φ2 are directly connected to the transfer gates 7a to function as the connecting portions 8c, whereby the shielding material line 8 transmitting the clock signal Φ2 may not be individually formed with the projecting portions 8b and the connecting portions 8c so that the manufacturing process can be simplified.

According to the first embodiment, the projecting portions 8a (8b) provided on the shielding material lines 8 are formed to be reduced in width as approaching to the transfer gates 7a so that the projecting portions 8a (8b) have the larger and smaller widths on the parts opposite and closer to the transfer gates 7a respectively. Thus, the wider parts of the projecting portions 8b opposite to the transfer gates 7a can effectively block light obliquely incident from above the prescribed pixels 5 upon the regions of other pixels 5, adjacent to the prescribed pixels 5, located under the transfer gates 7a entering ON-states in photoreception through the regions located under the shielding material lines 8. Further, the narrower parts of the projecting portions 8b, closer to the transfer gates 7a, provided on the shielding material line 8 transmitting the clock signal Φ2 are formed to be smaller in width than the transfer gates 7a so that the projecting portions 8b can be inhibited from projecting toward regions outside the transfer gates 7a when the projecting portions 8b directly connected to the transfer gates 7a deviate from the transfer gates 7a. Thus, the transfer gates 7a and the remaining transfer gates 7 adjacent to the transfer gates 7a can be inhibited from short circuits caused through the projecting portions 8b as a result of projection of the projecting portions 8b toward the regions outside the transfer gates 7a.

Second Embodiment

Figure 6:
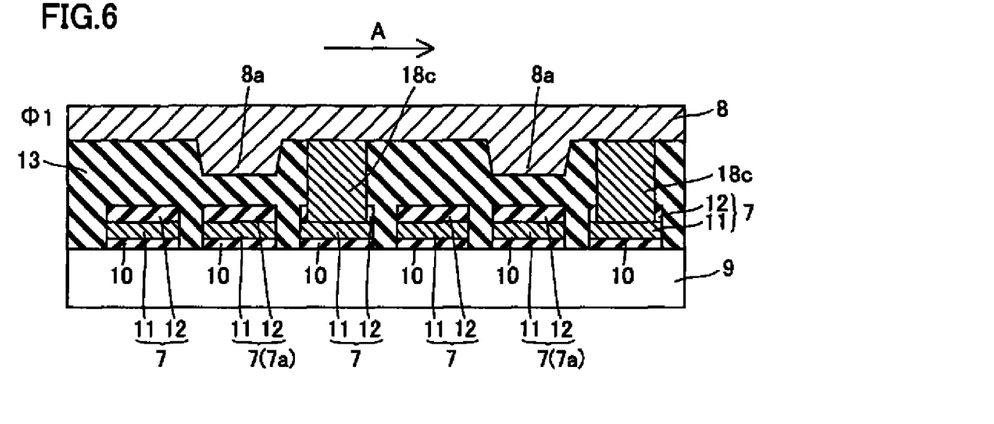
FIG. 6 is a sectional view of an imaging portion of a solid-state image sensor according to a second embodiment of the present invention, corresponding to the section of the imaging portion of the solid-state image sensor according to the first embodiment taken along the line 100-100 in FIG. 2.
Figure 7:
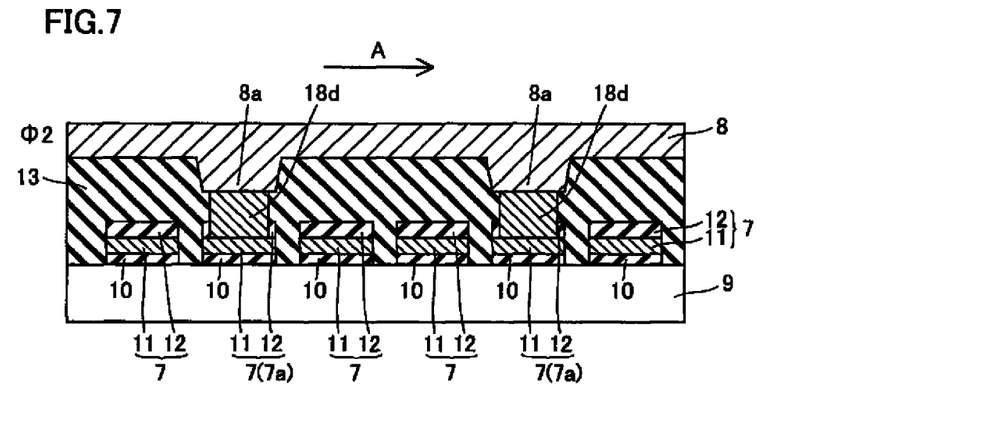
FIG. 7 is a sectional view of the imaging portion of the solid-state image sensor according to the second embodiment of the present invention, corresponding to the section of the imaging portion of the solid-state image sensor according to the first embodiment taken along the line 150-150 in FIG. 2.
Figure 8:
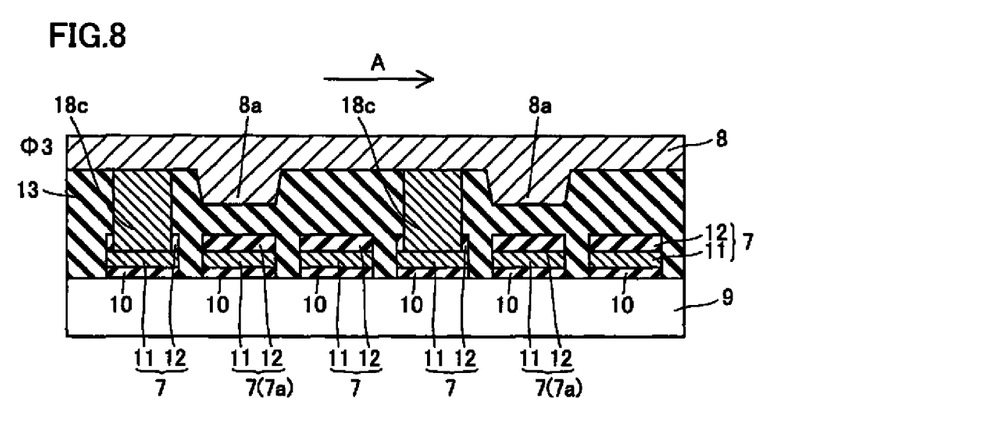
FIG. 8 is a sectional view of the imaging portion of the solid-state image sensor according to the second embodiment of the present invention, corresponding to the section of the imaging portion of the solid-state image sensor according to the first embodiment taken along the line 200-200 in FIG. 2.

Referring to FIGS. 6 to 8, shielding material lines 8 are connected to corresponding transfer gates 7 through transparent plugs 18c (18d) of polysilicon in an imaging portion of a solid-state image sensor according to a second embodiment of the present invention, dissimilarly to the aforementioned first embodiment. The plugs 18c (18d) are examples of the "connecting portion" in the present invention.

More specifically, the shielding material line 8 transmitting a clock signal Φ1 and the transfer gates 7 adjacent to transfer gates 7a entering ON-states in photoreception along an electron transfer direction (along arrow A) are connected with each other through the corresponding plugs 18c according to the second embodiment, as shown in FIG. 6. As shown in FIG. 8, further, the shielding material line 8 transmitting a clock signal Φ3 and the transfer gates 7 adjacent to the transfer gates 7a entering ON-states in photoreception oppositely to the electron transfer direction (along arrow A) are connected with each other through the corresponding plugs 18c.

According to the second embodiment, downward projecting portions 8a are formed on regions of the shielding material line 8, transmitting a clock signal Φ2, corresponding to the transfer gates 7a entering ON-states in photoreception, as shown in FIG. 7. The projecting portions 8a and the corresponding transfer gates 7a are connected with each other through corresponding plugs 18d. The plugs 18c (18d) are so formed as to reach polysilicon films 11 through SiN films 12 of the corresponding transfer gates 7. The projecting portions 8a project downward by about 300 nm from the lower surfaces of the shielding material lines 8. The remaining structure of the solid-state image sensor according to the second embodiment is similar to that of the solid-state image sensor according to the aforementioned first embodiment.

According to the second embodiment, as hereinabove described, the shielding material lines 8 are provided with the downward projecting portions 8a on the regions corresponding to the transfer gates 7a entering ON-states in photoreception for blocking light obliquely incident from above prescribed pixels 5 upon regions of other pixels 5, adjacent to the prescribed pixels 5, located under the transfer gates 7a entering ON-states in photoreception through regions located under the shielding material lines 8 to attain effects similar to those of the aforementioned first embodiment such that color mixture can be suppressed while suppressing increase of load capacitances of the transfer gates 7 and short circuits caused between adjacent pairs of transfer gates 7.

Third Embodiment

Figure 9:
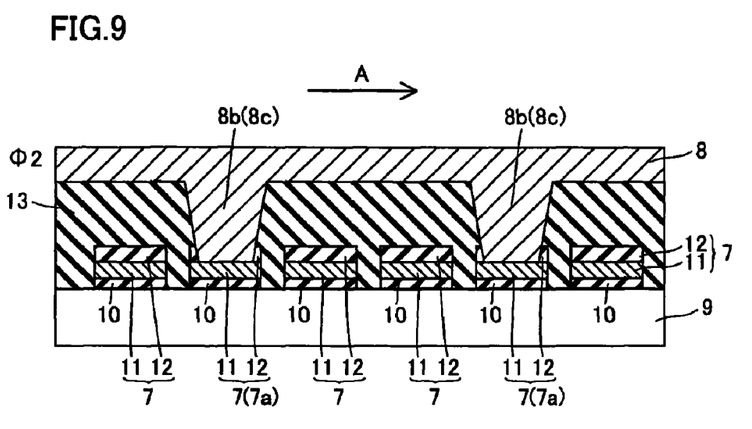
FIG. 9 is a sectional view of an imaging portion of a solid-state image sensor according to a third embodiment of the present invention, corresponding to the section of the imaging portion of the solid-state image sensor according to the second embodiment shown in FIG. 7 corresponding to the section taken along the line 150-150 in FIG. 2.

Referring to FIG. 9, projecting portions 8b (see FIG. 7) provided on a shielding material line 8 transmitting a clock signal Φ2 are directly connected to transfer gates 7a entering ON-states in photoreception to function also as connecting portions 8c in an imaging portion of a solid-state image sensor according to a third embodiment of the present invention, dissimilarly to the aforementioned second embodiment shown in FIGS. 6 to 8. More specifically, the projecting portions 8b projecting downward from the lower surface of the shielding material line 8 transmitting the clock signal Φ2 are formed to reach polysilicon films 11 through SiN films 12 of the corresponding transfer gates 7a. The projecting portions 8b project downward by about 450 nm from the lower surface of the shielding material line 8.

According to the third embodiment, the projecting portions 8b are formed to be reduced in width as approaching to the transfer gates 7a. The width of parts of the projecting portions 8b in contact with the polysilicon films 11 of the transfer gates 7a is smaller than the width of the transfer gates 7a. The remaining structure of the solid-state image sensor according to the third embodiment is similar to that of the solid-state image sensor according to the aforementioned second embodiment.

According to the third embodiment, as hereinabove described, the projecting portions 8b provided on the shielding material line 8 transmitting the clock signal Φ2 are directly connected to the transfer gates 7a to function as the connecting portions 8c so that the shielding material line 8 transmitting the clock signal Φ2 may not be individually formed with the projecting portions 8b and the connecting portions 8c, whereby a manufacturing process can be simplified.

According to the third embodiment, the projecting portions 8b provided on the shielding material line 8 transmitting the clock signal Φ2 are formed to be reduced in width as approaching to the transfer gates 7a so that parts of the projecting portions 8b opposite and closer to the transfer gates 7a have larger and smaller widths respectively. Thus, the wider parts of the projecting portions 8b opposite to the transfer gates 7a can effectively block light obliquely incident from above the prescribed pixels 5 upon the regions of other pixels 5, adjacent to the prescribed pixels 5, located under the transfer gates 7a entering ON-states in photoreception through the regions located under the shielding material line 8 transmitting the clock signal Φ2. Further, the narrower parts of the projecting portions 8b closer to the transfer gates 7a are formed to be smaller in width than the transfer gates 7a so that the projecting portions 8b can be inhibited from projecting toward regions outside the transfer gates 7a when the projecting portions 8b directly connected to the transfer gates 7a deviate from the transfer gates 7a as compared with a case of setting the width of the parts of the projecting portions 8b closer to the transfer gates 7a equivalently to the width of the transfer gates 7a. Thus, the transfer gates 7a and remaining transfer gates 7, adjacent to the transfer gates 7a, can be inhibited from short circuits caused through the projecting portions 8b as a result of projection of the projecting portions 8b toward the regions outside the transfer gates 7a.

In addition to the above, the solid-state image sensor according to the third embodiment can attain effects similar to those of the aforementioned first embodiment such that color mixture can be suppressed while suppressing increase of load capacitances of the transfer gates 7 and short circuits caused between adjacent pairs of transfer gates 7.

Fourth Embodiment

Figure 10:
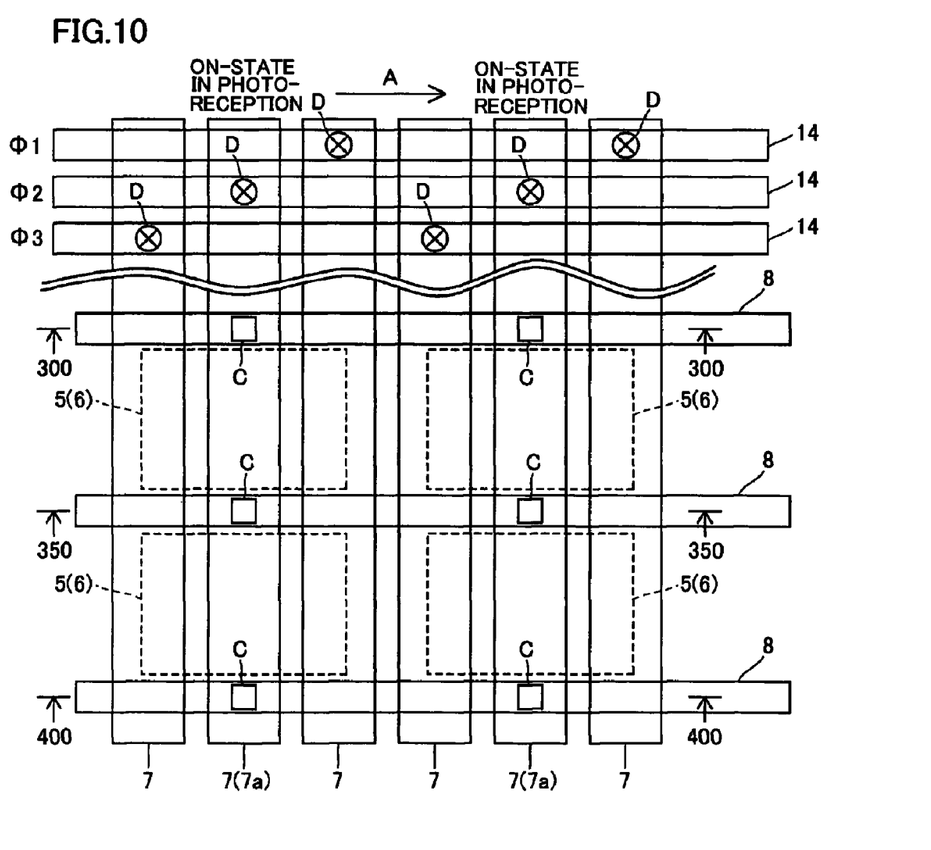
FIG. 10 is a plan view for illustrating the structure of an imaging portion of a solid-state image sensor according to a fourth embodiment of the present invention.
Figure 11:
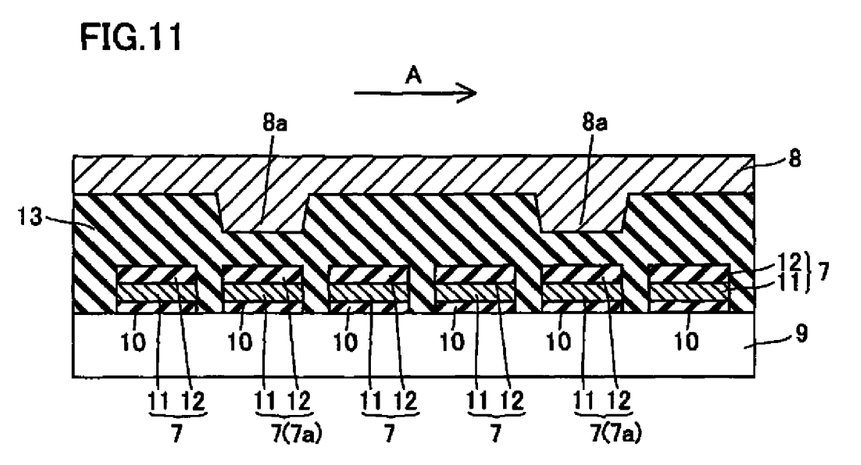
FIG. 11 is a common sectional view of the imaging portion of the solid-state image sensor according to the fourth embodiment taken along the lines 300-300, 350-350 and 400-400 in FIG. 10.

Referring to FIGS. 10 and 11, three signal lines 14 transmitting three-phase clock signals Φ1 to Φ3 to three transfer gates 7 provided in correspondence to each prescribed pixel 5 respectively are provided on a peripheral region of an imaging portion of a solid-state image sensor according to a fourth embodiment of the present invention, dissimilarly to the aforementioned first embodiment. Thus, shielding material lines 8 have no functions for serving as signal lines for transmitting the three-phase clock signals Φ1 to Φ3 to the transfer gates 7 respectively according to the fourth embodiment. In other words, the shielding material lines 8 have only functions for blocking light obliquely incident from above prescribed pixels 5 upon other pixels 5 adjacent to the prescribed pixels 5.

The signal lines 14 are arranged to extend along an electron transfer direction (along arrow A). The signal lines 14 and the transfer gates 7 are connected with each other on positions D perpendicular to each other on the aforementioned peripheral region of the imaging portion. Thus, the signal line 14 transmitting the clock signal Φ1 and the transfer gates 7 adjacent to transfer gates 7a entering ON-states in photoreception along the electron transfer direction (along arrow A) are connected with each other. Further, the signal line 14 transmitting the clock signal Φ2 and the transfer gates 7a entering ON-states in photoreception are connected with each other. In addition, the signal line 14 transmitting the clock signal Φ3 and the transfer gates 7 adjacent to the transfer gates 7a entering ON-states in photoreception oppositely to the electron transfer direction (along arrow A) are connected with each other.

According to the fourth embodiment, downward projecting portions 8a are provided on positions (positions C in FIG. 10) of the shielding material lines 8 intersecting with the transfer gates 7a entering ON-states in photoreception, as shown in FIG. 11. The projecting portions 8a are similar in structure to the projecting portions 8a according to the first embodiment shown in FIG. 3. The remaining structure of the solid-state image sensor according to the fourth embodiment is similar to that of the solid-state image sensor according to the aforementioned first embodiment.

According to the fourth embodiment, as hereinabove described, the shielding material lines 8 are provided with the downward projecting portions 8a on the regions corresponding to the transfer gates 7a entering ON-states in photoreception for blocking light obliquely incident from above prescribed pixels 5 upon regions of other pixels 5, adjacent to the prescribed pixels 5, located under the transfer gates 7a entering ON-states in photoreception through regions located under the shielding material lines 8 to attain effects similar to those of the aforementioned first embodiment such that color mixture can be suppressed while suppressing increase of load capacitances of the transfer gates 7 and short circuits caused between adjacent pairs of transfer gates 7.

Fifth Embodiment

Referring to FIGS. 12 to 15, only a shielding material line 8 transmitting a clock signal Φ2 is provided with downward projecting portions 8b on regions corresponding to transfer gates 7a entering ON-states in photoreception in an imaging portion 1 of a solid-state image sensor according to a fifth embodiment of the present invention, dissimilarly to the aforementioned first embodiment.

In other words, remaining two shielding material lines 8 transmitting clock signals Φ1 and Φ3 respectively are provided with no downward projecting portions on regions corresponding to the transfer gates 7a entering ON-states in photoreception. According to the fifth embodiment, the shielding material lines 8 are integrally formed with connecting portions 8c (see FIGS. 13 to 15) connecting the shielding material lines 8 and corresponding transfer gates 7 with each other on positions B shown in FIG. 12. The projecting portions 8b provided on the shielding material line 8 transmitting the clock signal Φ2 are directly connected to the transfer gates 7a, to function also as the connecting portions 8c.

The remaining structure of the solid-state image sensor according to the fifth embodiment is similar to that of the solid-state image sensor according to the aforementioned first embodiment.

According to the fifth embodiment, as hereinabove described, the shielding material lines 8 are so integrally provided with the connecting portions 8c connecting the shielding material lines 8 and the transfer gates 7 with each other that no connecting portions may be separately formed, whereby a manufacturing process can be inhibited from complication.

According to the fifth embodiment, the projecting portions 8b provided on the shielding material line 8 transmitting the clock signal Φ2 are directly connected to the transfer gates 7a to function as the connecting portions 8c so that the shielding material line 8 transmitting the clock signal Φ2 may not be individually formed with the projecting portions 8b and the connecting portions 8c, whereby the manufacturing process can be simplified.

According to the fifth embodiment, the projecting portions 8b provided on the shielding material line 8 transmitting the clock signal Φ2 are formed to be reduced in width as approaching to the transfer gates 7a so that the projecting portions 8b have larger and smaller widths on parts opposite and closer to the transfer gates 7a respectively. Thus, the wider parts of the projecting portions 8b opposite to the transfer gates 7a can effectively block light obliquely incident from above prescribed pixels 5 upon regions of other pixels 5, adjacent to the prescribed pixels 5, located under the transfer gates 7a entering ON-states in photoreception through regions located under the shielding material line 8. Further, the narrower parts of the projecting portions 8b closer to the transfer gates 7a are formed to be smaller in width than the transfer gates 7a so that the projecting portions 8b can be inhibited from projecting toward regions outside the transfer gates 7a when the projecting portions 8b directly connected to the transfer gates 7a deviate from the transfer gates 7a. Thus, the transfer gates 7a and the remaining transfer gates 7 adjacent to the transfer gates 7a can be inhibited from short circuits caused through the projecting portions 8b as a result of projection of the projecting portions 8b toward the regions outside the transfer gates 7a.

In addition to the above, the solid-state image sensor according to the fifth embodiment can attain effects similar to those of the aforementioned first embodiment such that color mixture can be suppressed while suppressing increase of load capacitances of the transfer gates 7a and short circuits caused between adjacent pairs of transfer gates 7.

Figure 12:
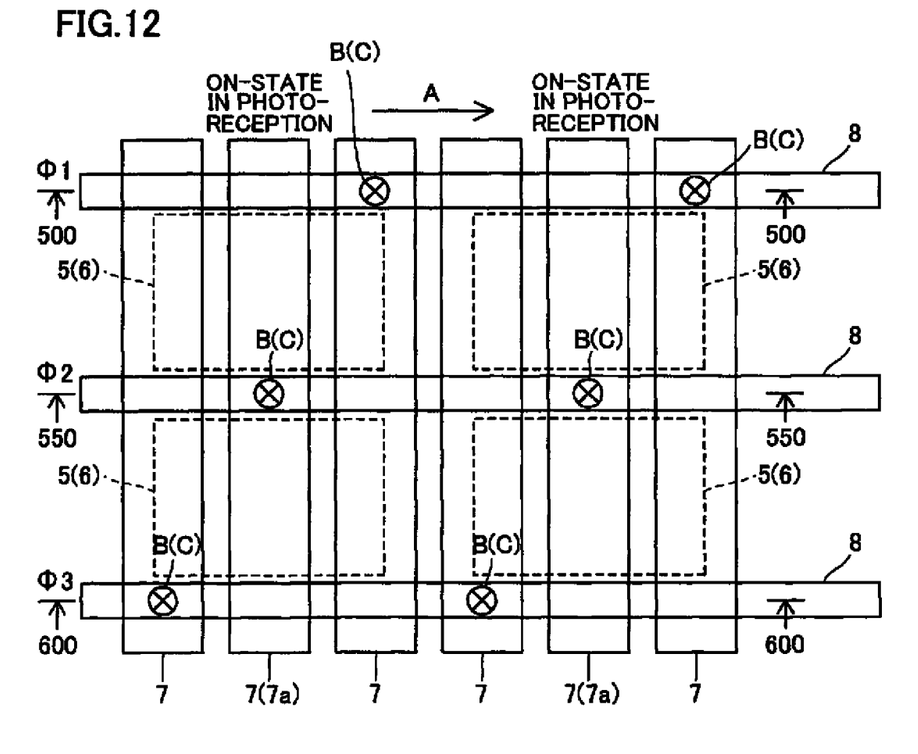
FIG. 12 is a plan view for illustrating the structure of an imaging portion of a solid-state image sensor according to a fifth embodiment of the present invention.
Figure 13:
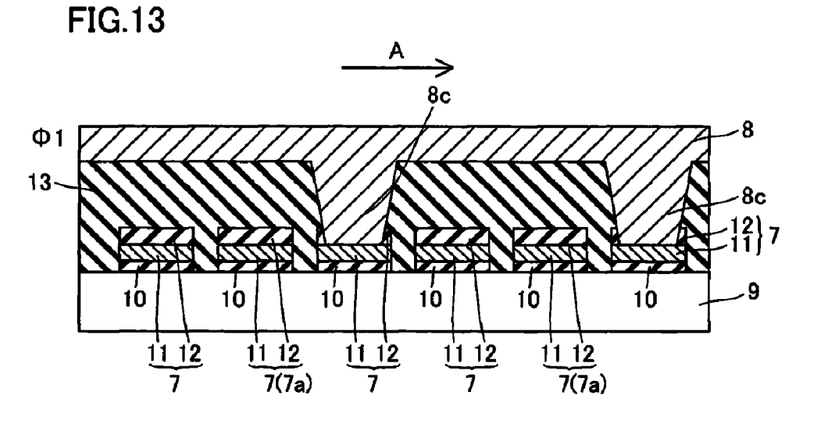
FIG. 13 is a sectional view of the imaging portion of the solid-state image sensor according to the fifth embodiment taken along the line 500-500 in FIG. 12.
Figure 14:
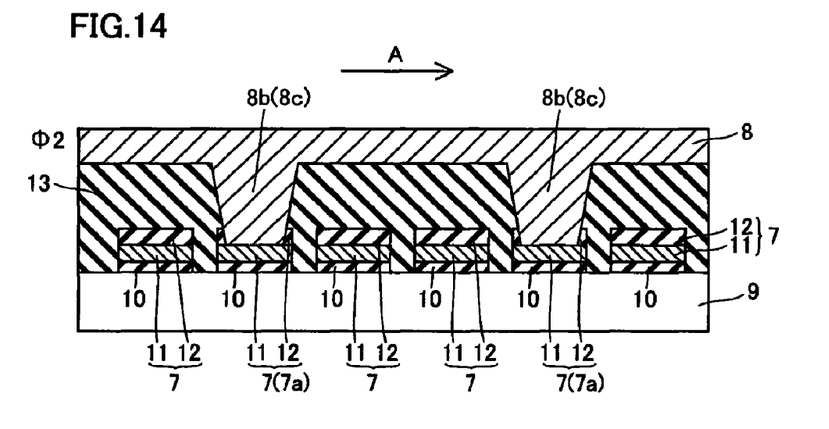
FIG. 14 is a sectional view of the imaging portion of the solid-state image sensor according to the fifth embodiment taken along the line 550-550 in FIG. 12.
Figure 15:
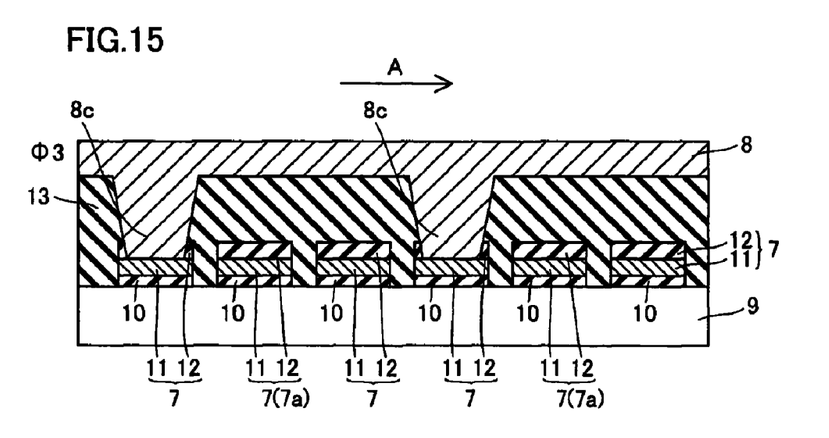
FIG. 15 is a sectional view of the imaging portion of the solid-state image sensor according to the fifth embodiment taken along the line 600-600 in FIG. 12.

According to the fifth embodiment, however, only the shielding material line 8 transmitting the clock signal Φ2 is formed with the downward projecting portions 8b on the regions corresponding to the transfer gates 7a entering ON-states in photoreception, and hence the solid-state image sensor can attain only ⅓ of the effect of suppressing color mixture in the case of providing projecting portions on all shielding material lines 8 transmitting the clock signals Φ1 to Φ3 respectively. However, color mixture can be suppressed in the pixels 5 prevented from incidence of unintentional oblique light through regions located under the shielding material line 8 by the projecting portions 8b provided on the shielding material line 8 transmitting the clock signal Φ2, whereby errors resulting from unintentional oblique incident light can be eliminated from electric signals obtained from all pixels 5 in the imaging portion 1 by processing the electric signals obtained from the pixels 5 with reference to the values of the electric signals obtained from these pixels 5.

Although the present invention has been described and illustrated in detail, it is clearly understood that the same is by way of illustration and example only and is not to be taken by way of limitation, the spirit and scope of the present invention being limited only by the terms of the appended claims.

For example, while only the central one of the three transfer gates provided in correspondence to each pixel enters an ON-state in photoreception while each projecting portion is provided on each shielding material line in correspondence to the transfer gate entering an ON-state in photoreception in each of the aforementioned embodiments, the present invention is not restricted to this but a plurality of transfer gates corresponding to each pixel may alternatively enter ON-states and each shielding material line may alternatively be provided with a plurality of projecting portions in correspondence to the plurality of transfer gates entering ON-states in photoreception.

While the present invention is applied to a frame transfer solid-state image sensor in each of the aforementioned embodiments, the present invention is not restricted to this but is also applicable to another type of solid-state image sensor other than the frame transfer type one.

While the projecting portions of the shielding material lines are formed to be reduced in width as approaching to the transfer gates entering ON-states in photoreception in each of the aforementioned embodiments, the present invention is not restricted to this but the projecting portions may alternatively be formed in another shape. In this case, the projecting portions are preferably so formed that the maximum with thereof is larger than the width of the transfer gates entering ON-states in photoreception.

While the projecting portions of the shielding material lines are provided on the regions corresponding to all transfer gates entering ON-states in photoreception in each of the aforementioned embodiments, the present invention is not restricted to this but the projecting portions of the shielding material lines may be provided on regions corresponding to at least one of the transfer gates entering ON-states in photoreception.

What is claimed is:

1. A solid-state image sensor comprising:
   a plurality of transfer gates for transferring charge;
   at least first and second pixels adjacent to each other having first and second photoelectric conversion portions, respectively;
   a shielding material line arranged on a region corresponding to the space separating said first and second pixels, said region being above said transfer gates, said shielding material line extending in a direction intersecting with the extensional direction of said transfer gates for blocking light incident from above said first pixel upon said second photoelectric conversion portion of said second pixel adjacent to said first photoelectric conversion portion of said first pixel; and
   a projecting portion integrated with said shielding material line and connected directly to one of said transfer gates entering an ON-state in photoreception, wherein
   said projecting portion has a thickness from a surface of said shielding material line to a surface connected to said transfer gate, the surface of said shielding material line facing said transfer gates, and
   the thickness of said projecting portion is greater than a thickness of said shielding material line which includes no projecting portion.

2. The solid-state image sensor according to claim 1, wherein
   said shielding material line is made of a conductive material.

3. The solid-state image sensor according to claim 2, wherein
   said shielding material line also has a function for serving as a signal line transmitting a driving signal for driving said transfer gates.

4. The solid-state image sensor according to claim 3, wherein
   a connecting portion where said shielding material line and said transfer gates are connected with each other is provided independently of said shielding material line.

5. The solid-state image sensor according to claim 1, further comprising a reflex inhibition film consisting of an insulating film formed on said transfer gates, wherein
   a connecting portion where said shielding material line and said transfer gates are connected directly with each other is formed to reach said transfer gates through said reflex inhibition film.

6. The solid-state image sensor according to claim 1, wherein
   three said transfer gates are arranged for single said pixel, and said three transfer gates corresponding to said first or second pixel are driven by three-phase said driving signals,
   three said shielding material lines transmitting said three-phase driving signals respectively constitute a group, and
   said projecting portion is provided on a region of at least one said shielding material line, included in said three shielding material lines constituting said group, corresponding to said transfer gate entering an ON-state in photoreception.

7. The solid-state image sensor according to claim 6, wherein
   a plurality of projecting portions including said projecting portion are provided on regions of all said shielding material lines, constituting said group, corresponding to said transfer gate entering an ON-state in photoreception.

8. The solid-state image sensor according to claim 3, wherein
   a connecting portion is integrally provided on a flat portion of said shielding material line other than said projecting portion and connected to remaining said transfer gate other than said transfer gate entering an ON-state in photoreception, and
   said projecting portion of said shielding material line is directly connected to said transfer gate entering an ON-state in photoreception.

9. The solid-state image sensor according to claim 3, wherein
   a flat portion of said shielding material line other than said projecting portion is connected to remaining said transfer gate other than said transfer gate entering an ON-state in photoreception through a connecting portion provided independently of said shielding material line, and
   said projecting portion of said shielding material line is connected to said transfer gate entering an ON-state in photoreception through said connecting portion provided independently of said shielding material line.

10. The solid-state image sensor according to claim 3, wherein
   a flat portion of said shielding material line other than said projecting portion is connected to remaining said transfer gate other than said transfer gate entering an ON-state in photoreception through a connecting portion provided independently of said shielding material line, and
   said projecting portion of said shielding material line is directly connected to said transfer gate entering an ON-state in photoreception.

11. The solid-state image sensor according to claim 1, wherein
   the maximum width of said projecting portion is larger than the width of said transfer gate entering an ON-state in photoreception.

12. The solid-state image sensor according to claim 1, wherein
   said projecting portion is formed to be reduced in width as approaching to said transfer gates.

13. The solid-state image sensor according to claim 12, wherein
   the width of the bottom of said projecting portion is larger than the width of said transfer gates.

14. The solid-state image sensor according to claim 12, wherein
   the width of the forward end of said projecting portion is smaller than the width of said transfer gates.

15. The solid-state image sensor according to claim 1, wherein
   said projecting portion of said shielding material line is provided on a region corresponding to all said transfer gates entering ON-states in photoreception.

16. The solid-state image sensor according to claim 1, wherein
   said projecting portion has a tapered shape which becomes gradually thinner toward said transfer gate.

17. A solid-state image sensor comprising:
   a plurality of transfer gates for transferring charge;
   at least first and second pixels adjacent to each other having first and second photoelectric conversion portions, respectively;
   a shielding material line arranged on a region corresponding to the space separating said first and second pixels, said region being above said transfer gates, said shielding material line extending in a direction intersecting with the extensional direction of said transfer gates for blocking light incident from above said first pixel upon said second photoelectric conversion portion of said second pixel adjacent to said first photoelectric conversion portion of said first pixel; and
   a projecting portion integrated with said shielding material line and connected directly to one of said transfer gates entering an ON-state in photoreception, wherein
   said projecting portion has a tapered shape which becomes gradually thinner toward said transfer gate.

18. The solid-state image sensor according to claim 17, wherein
   said shielding material line is made of a conductive material.

19. The solid-state image sensor according to claim 18, wherein
   said shielding material line also has a function for serving as a signal line transmitting a driving signal for driving said transfer gates.

20. The solid-state image sensor according to claim 19, wherein
   a connecting portion where said shielding material line and said transfer gates are connected with each other is provided independently of said shielding material line.

21. The solid-state image sensor according to claim 17, further comprising a reflex inhibition film consisting of an insulating film formed on said transfer gates, wherein
   a connecting portion where said shielding material line and said transfer gates are connected directly with each other is formed to reach said transfer gates through said reflex inhibition film.

22. The solid-state image sensor according to claim 17, wherein
   three said transfer gates are arranged for single said pixel, and said three transfer gates corresponding to said first or second pixel are driven by three-phase said driving signals,
   three said shielding material lines transmitting said three-phase driving signals respectively constitute a group, and
   said projecting portion is provided on a region of at least one said shielding material line, included in said three shielding material lines constituting said group, corresponding to said transfer gate entering an ON-state in photoreception.

23. The solid-state image sensor according to claim 22, wherein
   a plurality of projecting portions including said projecting portion are provided on regions of all said shielding material lines, constituting said group, corresponding to said transfer gate entering an ON-state in photoreception.

24. The solid-state image sensor according to claim 19, wherein
   a connecting portion is integrally provided on a flat portion of said shielding material line other than said projecting portion and connected to remaining said transfer gate other than said transfer gate entering an ON-state in photoreception, and
   said projecting portion of said shielding material line is directly connected to said transfer gate entering an ON-state in photoreception.

25. The solid-state image sensor according to claim 19, wherein
   a flat portion of said shielding material line other than said projecting portion is connected to remaining said transfer gate other than said transfer gate entering an ON-state in photoreception through a connecting portion provided independently of said shielding material line, and
   said projecting portion of said shielding material line is connected to said transfer gate entering an ON-state in photoreception through said connecting portion provided independently of said shielding material line.

26. The solid-state image sensor according to claim 19, wherein
   a flat portion of said shielding material line other than said projecting portion is connected to remaining said transfer gate other than said transfer gate entering an ON-state in photoreception through a connecting portion provided independently of said shielding material line, and
   said projecting portion of said shielding material line is directly connected to said transfer gate entering an ON-state in photoreception.

27. The solid-state image sensor according to claim 17, wherein
the maximum width of said projecting portion is larger than the width of said transfer gate entering an ON-state in photoreception.

28. The solid-state image sensor according to claim 17, wherein
said projecting portion is formed to be reduced in width as approaching to said transfer gates.

29. The solid-state image sensor according to claim 28, wherein
the width of the bottom of said projecting portion is larger than the width of said transfer gates.

30. The solid-state image sensor according to claim 28, wherein
the width of the forward end of said projecting portion is smaller than the width of said transfer gates.

31. The solid-state image sensor according to claim 17, wherein
said projecting portion of said shielding material line is provided on a region corresponding to all said transfer gates entering ON-states in photoreception.

32. The solid-state image sensor according to claim 17, wherein
said projecting portion has a thickness from a surface of said shielding material line to a surface connected to said transfer gate, the surface of said shielding material line facing said transfer gates, and
the thickness of said projecting portion is greater than a thickness of said shielding material line which includes no projecting portion.

33. A solid-state image sensor comprising:
a plurality of transfer gates for transferring charge;
at least first and second pixels adjacent to each other having first and second photoelectric conversion portions, respectively;
a shielding material line arranged on a region corresponding to the space separating said first and second pixels, said region being above said transfer gates, said shielding material line extending in a direction intersecting with the extensional direction of said transfer gates for blocking light incident from above said first pixel upon said second photoelectric conversion portion of said second pixel adjacent to said first photoelectric conversion portion of said first pixel;
a first projecting portion integrated with said shielding material line and connected directly to one of said transfer gates entering an ON-state in photoreception; and
a second projecting portion integrated with shielding material line, the second projecting portion extending toward, but not directly contacting, another of said transfer gates entering the ON-state in photoreception.

34. A solid-state image sensor comprising:
a plurality of transfer gates for transferring charge;
at least first and second pixels adjacent to each other having first and second photoelectric conversion portions, respectively;
a shielding material line arranged on a region corresponding to the space separating said first and second pixels, said region being above said transfer gates, said shielding material line extending in a direction intersecting with the extensional direction of said transfer gates for blocking light incident from above said first pixel upon said second photoelectric conversion portion of said second pixel adjacent to said first photoelectric conversion portion of said first pixel; and
a projecting portion integrated with said shielding material line, the projecting portion extending toward, but not directly contacting, one of said transfer gates entering an ON-state in photoreception, wherein
the projecting portion does not extend along the entire length of the shielding material line.

* * * * *